(12) United States Patent
Antoniadis et al.

(10) Patent No.: US 7,321,193 B2
(45) Date of Patent: Jan. 22, 2008

(54) DEVICE STRUCTURE FOR OLED LIGHT DEVICE HAVING MULTI ELEMENT LIGHT EXTRACTION AND LUMINESCENCE CONVERSION LAYER

(75) Inventors: Homer Antoniadis, Mountain View, CA (US); Benjamin Claus Krummacher, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/345,795

(22) Filed: Feb. 1, 2006

(65) Prior Publication Data

US 2007/0159061 A1    Jul. 12, 2007

Related U.S. Application Data

(63) Continuation-in-part of application No. 11/264,516, filed on Oct. 31, 2005.

(51) Int. Cl.
*H01J 1/62*    (2006.01)
(52) U.S. Cl. ...................... 313/501; 313/506
(58) Field of Classification Search ......... 313/498–512
See application file for complete search history.

(56) References Cited

U.S. PATENT DOCUMENTS

| | | | | |
|---|---|---|---|---|
| 2001/0026124 | A1* | 10/2001 | Liu et al. ................ | 313/504 |
| 2001/0030326 | A1 | 10/2001 | Reeh et al. | |
| 2001/0033135 | A1* | 10/2001 | Duggal et al. ........... | 313/506 |
| 2002/0063517 | A1 | 5/2002 | Hosokawa | |
| 2003/0020399 | A1* | 1/2003 | Moller et al. ............ | 313/504 |
| 2003/0111955 | A1* | 6/2003 | McNulty et al. ......... | 313/504 |
| 2003/0218420 | A1* | 11/2003 | Zovko .................... | 313/506 |
| 2004/0046497 | A1* | 3/2004 | Schaepkens et al. ..... | 313/506 |
| 2004/0061130 | A1 | 4/2004 | Morizuka | |
| 2004/0061136 | A1 | 4/2004 | Tyan et al. | |
| 2004/0145308 | A1 | 7/2004 | Rossner et al. | |
| 2004/0212296 | A1* | 10/2004 | Nakamura et al. ...... | 313/504 |
| 2004/0217702 | A1* | 11/2004 | Garner et al. ........... | 313/512 |
| 2005/0023967 | A1* | 2/2005 | Gotoh et al. ............ | 313/504 |

(Continued)

FOREIGN PATENT DOCUMENTS

EP    0 973 358 A2    1/2000

(Continued)

OTHER PUBLICATIONS

Anil R. Duggal, et al., "Organic Light-Emitting Devices for Illumination Quality White Light", May 13, 2002, Applied Physics Letters, vol. 80, No. 19, 3470-3472 pp.

(Continued)

*Primary Examiner*—Joseph Williams
*Assistant Examiner*—Bumsuk Won
(74) *Attorney, Agent, or Firm*—Fish & Richardson P.C.

(57) ABSTRACT

An apparatus such as a light source has a multi-element light extraction and luminescence conversion layer disposed over a transparent layer of the light source and on the exterior of said light source. The multi-element light extraction and luminescence conversion layer includes a plurality of light extraction elements and a plurality of luminescence conversion elements. The light extraction elements diffuses the light from the light source while luminescence conversion elements absorbs a first spectrum of light from said light source and emits a second spectrum of light.

39 Claims, 3 Drawing Sheets

U.S. PATENT DOCUMENTS

| | | |
|---|---|---|
| 2005/0026530 A1* | 2/2005 | Toguchi et al. ............... 445/24 |
| 2005/0029513 A1 | 2/2005 | Kawashima et al. |
| 2005/0142379 A1* | 6/2005 | Juni et al. .................. 428/690 |
| 2005/0181232 A1 | 8/2005 | Ricks et al. |
| 2006/0186802 A1* | 8/2006 | Cok et al. .................. 313/506 |

FOREIGN PATENT DOCUMENTS

| | | |
|---|---|---|
| JP | 2001-148287 | 5/2001 |
| WO | WO 2004/040661 A2 | 5/2004 |

OTHER PUBLICATIONS

A. Niko et al., "Red-green-blue emission or paranexaphenyl devices with color-converting media", Nov. 1997, Journal of Applied Physics, vol. 82, No. 9, pp. 4177-4182.

Shigeo Shinoya et al., "Phosphor Handbook", 1999, CRC Press LLC, pp. 736-738.

J. J. Shiang et al., "Application of radiative transport theory to light extraction from organic light emitting diodes", Mar. 1, 2004, Journal of Applied Physics, vol. 95, No. 5, pp. 2880-2888.

W. H. Melhuish, "Quantum Efficiencies of Fluorescence of Organic Substances Effect of Solvent and Concentration of the Flourescent Solute", Feb. 1961, Journal of Phys. Chem. 65, pp. 229-235.

International Search Report and Written Opinion of the International Search Authority, International Application Serial No. PCT/EP2006/004777, Sep. 21, 2006, 9 pp.

Anil R. Duggal et al., "Organic Light-Emitting Devices for Illumination Quality White Light", May 13, 2002, Applied Physics Letters, vol. 80, No. 19, pp. 3470-3472.

A. Niko et al., "Red-green-blue emission or paranexaphenyl devices with color-converting media", Nov. 1997, Journal of Applied Physics, vol. 82, No. 9, pp. 4177-4182.

Shigeo Shinoya et al., "Phosphor Handbook", 1999, CRC Press LLC, pp. 736-738.

J. J. Shiang et al., "Application of radiative transport theory to light extraction from organic light emitting diodes", Mar. 1, 2004, Journal of Applied Physica, vol. 95, No. 5, pp. 2880-2888.

W. H. Melhuish, "Quantum Efficiencies of Fluorescence of Organic Substances: Effect of Solvent and Concentration of the Flourescent Solute", Feb. 1961, Journal of Phys. Chem. 65, pp. 229-235.

International Search Report and Written Opinion of the International Search Authority, International Application Serial No. PCT/EP2006/004777, Sep. 21, 2006, 9 pp.

* cited by examiner

DEVICE STRUCTURE FOR OLED LIGHT DEVICE HAVING MULTI ELEMENT LIGHT EXTRACTION AND LUMINESCENCE CONVERSION LAYER

RELATED APPLICATIONS

This application is a continuation-in-part of a currently co-pending, commonly assigned US patent application entitled "Structured Luminescence Conversion Layer" filed on Oct. 31, 2005, bearing Ser. No. 11/264,516. This application is also related to a currently co-pending commonly assigned US patent application entitled "Using Prismatic Microstructured Films for Image Blending in OLEDs" filed on Aug. 29, 2005, bearing Ser. No. 11/215,548.

GOVERNMENT RIGHTS

This invention was made with Government support under Contract No. DE-FC26-04NT41947 awarded by the Department of Energy. The Government may have certain rights in the invention.

BACKGROUND

Display and lighting systems based on LEDs (Light Emitting Diodes) have a variety of applications. Such display and lighting systems are designed by arranging a plurality of photo-electronic elements ("elements") such as rows of individual LEDs. LEDs that are based upon semiconductor technology have traditionally used inorganic materials, but recently, the organic LED ("OLED") has become a potential substitute. Examples of other elements/devices using organic materials include organic solar cells, organic transistors, organic detectors, and organic lasers.

An OLED is typically comprised of two or more thin organic layers (e.g., an electrically conducting organic layer and an emissive organic layer which emits light) which separate an anode and a cathode layer. Under an applied forward potential, the anode injects holes into the stack of organic layers, while the cathode injects electrons. The injected holes and electrons each migrate (under the influence of an externally applied electric field) toward the opposite electrode and recombine in the emissive layer under emission of a photon. Similar device structure and device operation applies for OLEDs consisting of small molecule organic layers and/or polymeric organic layers. Each of the OLEDs can be a pixel element in a passive/active matrix OLED display or an single element used as a general area light source and the like.

The construction of OLED light sources and OLED displays from individual OLED elements or devices is well known in the art. The displays and light sources may have one or more common layers such as common substrates, anodes or cathodes and one or more common organic layers sandwiched in between. They may also consist of photo-resist or electrical separators, bus lines, charge transport and/or charge injection layers, and the like. Typically, a transparent or semi-transparent glass substrate is used in bottom-emitting OLED devices.

White-emitting OLED-lighting devices can be generated by applying a continuous down-conversion layer on the light emitting side of a blue OLED. The down-conversion layer comprises of a color changing material, for example phosphor particles or organic dyes.

The phosphor layer can be structured as illustrated in the commonly-assigned US patent application entitled "Structured Luminescence Conversion Layer" filed on Oct. 31, 2005, bearing Ser. No. 11/264,516 (attorney docket number 2005P07780US). Such structuring gives more flexibility in designing output spectra of down-conversion light sources. This flexibility allows finding a better compromise between efficiency and color rendering.

The mismatch of the refractive index between air and the OLED leads to most of the generated light being lost through total internal reflection into wave guiding modes and self absorption. Applying a phosphor layer or a scattering layer on the light emitting side of an OLED-device increases the output of OLEDs due to volumetric scattering mechanisms. Light extraction can also be improved by texturing the light emitting side of an OLED, for example by sand blasting or etching as described in a currently co-pending commonly assigned US patent application entitled "Using Prismatic Microstructured Films for Image Blending in OLEDs" filed on Aug. 29, 2005, bearing Ser. No. 11/215,548 (atty docket number 2005P04661US).

DETAILED DESCRIPTION

Figure 1:
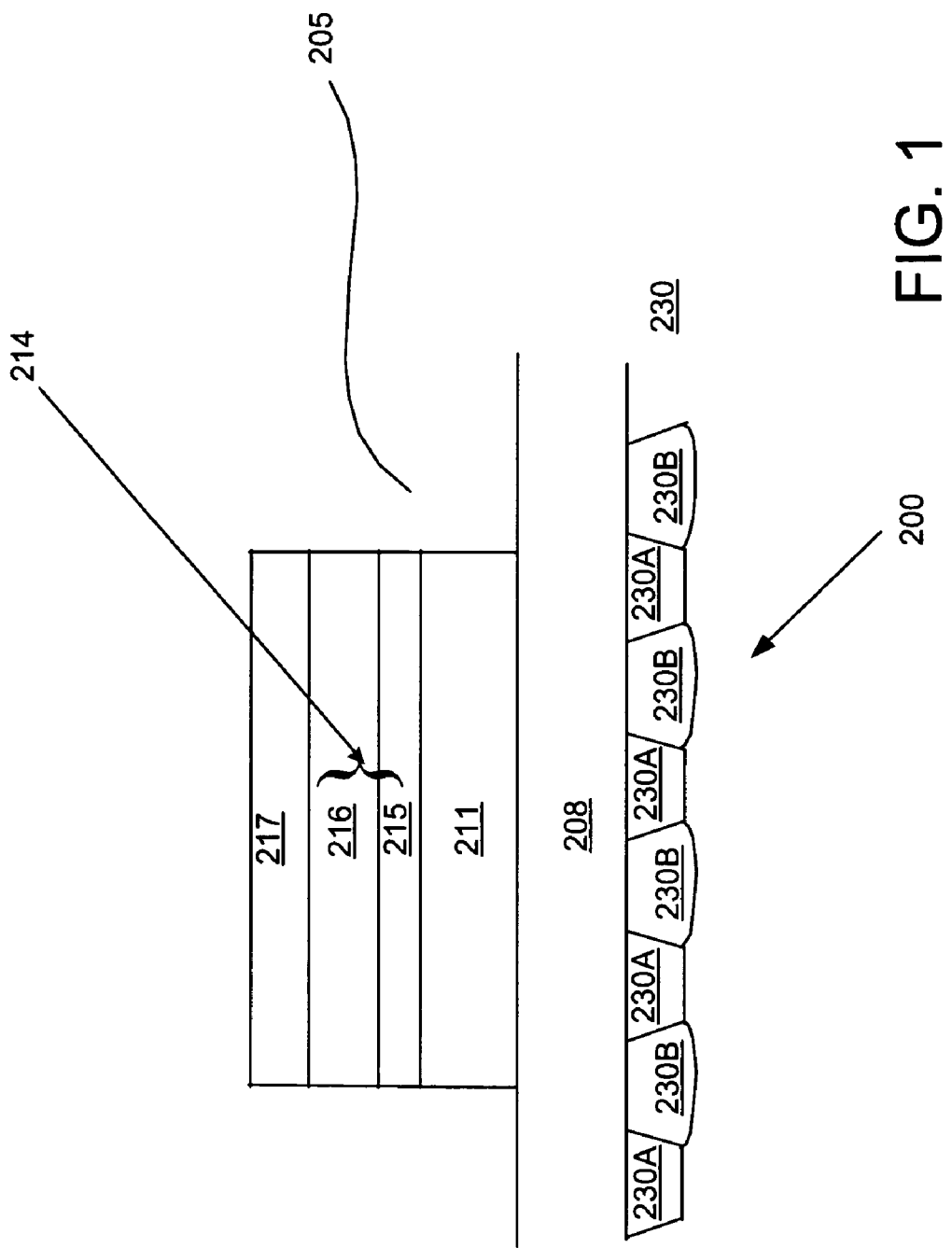
FIG. 1 shows a cross-sectional view of an embodiment of an electroluminescent (EL) apparatus 200 according to at least one embodiment of the invention.

In at least one embodiment of the invention, an electroluminescent (EL) apparatus is disclosed which utilizes 1) an OLED device or light source including a transparent layer for light emission; and 2) a multi-element light extraction and luminescence conversion layer disposed in the path of light emission from the OLED device or light source and on the outside of the OLED device on the exterior side of the transparent layer. The multi-element light extraction and luminescence conversion layer comprises at least one light extraction element(s) and at least one luminescence conversion element(s). The light extraction element(s) diffuses the light from the light source while the luminescence conversion element(s) absorbs part of a first spectrum of light from the light source and emits a second spectrum of light. The non-absorbed part of the first spectrum of light and the second spectrum of light from the luminescence conversion element(s) combines with the diffused light output from the light extraction element(s) to give a total output spectrum of light for the electroluminescent apparatus. The elements of the layer adjacent to one another and adjacent directly to said transparent layer. Thus, they are not stacked vertically, but rather each element occupies a certain area on the exterior surface of the transparent layer of the light source.

The luminescence conversion element(s) comprises at least one color changing material(s) (such as a phosphor) which is defined herein as a material which can absorb light in one spectrum and emit light in another spectrum. The color-changing material(s) within the color-changing regions may be embedded in a transparent matrix. All of the color-changing material(s) in the luminescence conversion element can be of the same material or can be different material and may comprise for instance of scattering particles, phosphor particles and so on. For instance, some of the luminescence conversion element(s) may be orange emitting while others are yellow emitting. The ratio of the surface area (or width or other dimension) of the luminescence conversion element(s) versus the light extraction element(s) affects the total output spectrum of the EL apparatus. Due to the addition of this ratio, the use of a multi-element light extraction and luminescence conversion layer gives greater flexibility in designing the output spectra than when uniform conversions layers are used. The flexibility enables finding a better compromise between efficiency and color rendering.

According to a model described in literature, the output spectrum of an EL apparatus with a uniform down conversion or color-changing material layer is given by:

$$A_{\alpha,\delta}(\lambda)=S_0(\lambda)\exp[-\alpha_1(\lambda)\delta]+W_{\alpha,\delta}C_{\alpha,\delta}(\lambda)P(\lambda) \quad (1),$$

where $\alpha(\lambda)$ is the absorption coefficient of the luminescence conversion element as related to the color-changing material concentration, $\delta$ is the effective optical path length which may be related but not necessarily equal to the thickness of the element (due to scattering). $P(\lambda)$ is normalized so that its integral over all wavelength is unity. $W_{\alpha,\delta}$ is a weight factor. C is the self absorption correction. $S_o(\lambda)$ is the emission spectrum of the light source.

Based on the rules of color mixing, the output spectrum of an identical EL apparatus with a multi-element light extraction and luminescence conversion layer in accordance with the invention is given by:

$$B_{\alpha,\delta,x}(\lambda)=(1-x)S_0(\lambda)+x\{S_0(\lambda)\exp[-\alpha(\lambda)\delta]+W_{\alpha,\delta}C_{\alpha,\delta}(\lambda)P(\lambda)]\} \quad (2),$$

where x (=0 . . . 1) is related to the size/configuration of the luminescence conversion elements, and (1−x) is related to the size/configuration of the light extraction elements.

The weight factor $W_{\alpha,\delta}$ is given by:

$$W_{\alpha,\delta}=Q\int S_0(\lambda)(1-\exp[-\alpha(\lambda)\delta])d\lambda,$$

where Q is the quantum yield of the color-changing material used in the luminescence conversion elements.

The self absorption correction $C_{\alpha,\delta}(\lambda)$ is given by:

$$C_{\alpha,\delta}(\lambda)=\exp[-\alpha(\lambda)\delta]/(1-Q\int P(\lambda)(1-\exp[-\alpha(1)\delta]d\lambda.$$

The above assumes effective path length for the absorption process is equal to the effective path length for the luminescence. As a result of the model described in equation 2 above, the differentiation between luminescence conversion elements (related to the multiplier x) and light extraction elements (related to the multiplier 1−x) enables a greater ability to tune the output spectra more precisely.

Preferably, the color-changing material(s) selected for inclusion in the luminescence conversion element(s) are such that the light output of the EL apparatus is below the photon saturation limit of the luminescence conversion element. In alternate embodiments, the photon saturation limit may even be exceeded.

The light extraction element(s) of the multi-element light extraction and luminescence conversion layer includes a plurality of non-color-changing light transmitting regions. The light extraction element has a refractive index ($n_1$) equal or close to the refractive index of the transparent layer of the OLED device or light source (which is adjacent to and transmits light to the multi-element layer). The refractive index ($n_2$) of the luminescence conversion element is designed to be less than $n_1$. The preferred shape of the light extraction element is trapezoidal or an emboss-type geometry. The preferred shape of the luminescence conversion element is flat or lens-like. Preferably, both the light extraction element(s) and the luminescence conversion element(s) comprise of materials with a low absorption coefficient.

The light extraction element can be fabricated by molding an uncured continuous layer or by photolithography. The luminescence conversion element can be fabricated by volume casting, screen printing, inkjet printing, photolithography, and so on.

FIG. 1 shows a cross-sectional view of an embodiment of an electroluminescent (EL) apparatus 200 according to at least one embodiment of the invention. The EL apparatus 200 includes an OLED device 205 and a multi-element light extraction and luminescence conversion layer (MLELC) layer 230. OLED device 205 includes substrate 208 and a first electrode 211 on the substrate 208. The first electrode 211 may be patterned for pixilated applications or un-patterned for backlight or other general lighting applications. The OLED device 205 also includes a semiconductor stack 214 on the first electrode 211. The semiconductor stack 214 includes at least the following: (1) an anode buffer layer (ABL) 215 and (2) an active light emitting layer (EML) 216.

As shown in FIG. 1, the OLED device 205 is a bottom-emitting device. As a bottom-emitting device, the first electrode 211 acts as an anode, and the ABL 215 is deposited onto the first electrode 211, and the EML 216 is deposited onto the ABL 215. Finally, the OLED device 205 also includes a second electrode 217 deposited onto the organic semiconductor stack 214. Other layers than that shown in FIG. 1 may also be added such as insulating layers, barrier layers, electron/hole injection and blocking layers, getter layers, and so on. In accordance with the invention, the MLELC layer 230 is disposed on the outside of the OLED device 205. More specifically, in the configuration shown, the MLELC layer 230 is disposed on the substrate 208. The OLED device 205 and the MLELC layer 230 together comprise the EL apparatus 200. Exemplary embodiments of these layers are described in greater detail below.

Substrate 208:

The substrate 208 can be any material, which can support the additional layers and electrodes, and is transparent or semi-transparent to the wavelength of light emitted by the OLED device 205. Preferable substrate materials include glass, quartz, and plastic, preferably, thin, flexible glass. The preferred thickness of the substrate 208 depends on the material used and on the application of the device. The substrate 208 can be in the form of a sheet or continuous film. The continuous film is used, for example, for roll-to-roll manufacturing processes which are particularly suited for plastic, metal, and metallized plastic foils.

First Electrode 211:

In the bottom-emitting configuration, the first electrode 211 functions as an anode (the anode is a conductive layer which serves as a hole-injecting layer). Typical anode materials include metals (such as platinum, gold, palladium, indium, and the like); conductive oxides (such as lead oxide, tin oxide, indium-tin oxide (ITO), and the like); graphite; and doped conducting polymers (such as polyaniline, polypyrrole, polythiophene, and the like). Preferably, the first electrode 211 is comprised of indium-tin oxide (ITO).

For OLEDS, the first electrode layer 211 is usually thin enough so as to be semi-transparent and allow at least a fraction of light to transmit through (in bottom emitting OLEDS). The thickness of the first electrode 211 is from about 10 nm to about 1000 nm, preferably, from about 50 nm to about 200 nm, and more preferably, is about 100 nm. As such, any thin-film deposition method may be used in the first electrode fabrication step. These include, but are not limited to, vacuum evaporation, sputtering, electron beam deposition, chemical vapor deposition, etching and other techniques known in the art and combinations thereof. The process also usually involves a baking or annealing step in a controlled atmosphere to optimize the conductivity and optical transmission of anode layer. Photolithography can then be used to define any pattern, if desired, upon the first electrode 211.

ABL 215:

The ABL 215 has good hole conducting properties and is used to effectively inject holes from the first electrode 211 to the EML 216. The ABL 215 is made of polymers or small molecule materials or other material. For example, the ABL 215 can be made from tertiary amine or carbazole derivatives both in their small molecule or their polymer form, conducting polyaniline ("PANI"), or PEDOT:PSS (a solution of poly(3,4-ethylenedioxythiophene) ("PEDOT") and polystyrenesulfonic acid ("PSS") (available as Baytron P from HC Starck). The ABL 215 can have a thickness from about 5 nm to about 1000 nm, and is conventionally used from about 50 to about 250 nm. Other examples of the ABL 215 include copper phthalocyanine (CuPc) films with preferred thicknesses between 10 and 50 nm. Other such examples of ABL materials are well-known in the art and can readily be substituted for or combined with the above-mentioned materials.

The ABL 215 can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating.

EML 216:

The active light emitting layer (EML) 216 is comprised of an organic electroluminescent material which emits light upon application of a potential across first electrode 211 and second electrode 217. The EML may be fabricated from materials organic or organo-metallic in nature, and may include polymer, monomer and/or small molecule emitters. As used herein, the term organic also includes organo-metallic materials. Light-emission in these materials may be generated as a result of fluorescence and/or phosphorescence.

Organic materials may comprise of one or more of a polymer, polymer blend, monomer, oligomer, co-polymer, an organic side-group, small molecule or blend of any of these. The EML 216 can comprise of, for example, conjugated EL polymers, such as polyfluorenes, polythiophenes, polyphenylenes, polythiophenevinylenes, polyspiro polymers, or poly-p-phenylenevinylenes or their families, copolymers, derivatives, blends, or mixtures thereof that emit white, red, blue, yellow, orange, green or any single or combined spectrum of light.

The EML 216 can be a continuous film that is non-selectively deposited (e.g. spin-coating, dip coating etc.) or discontinuous regions that are selectively deposited (e.g. by ink-jet printing). EML 216 may also be fabricated by vapor deposition, sputtering, vacuum deposition etc. as desired.

The EML 216 can be composed of more than one light emitting element (for instance, a host and dopant). In the case of two light-emitting elements, the relative concentration of the host element and the dopant element can be adjusted to obtain the desired color. The EML 216 can emit light in any desired color and be comprised of polymers, co-polymers, dopants, quenchers, and hole and electron transport materials as desired. For instance, the EML 216 can emit light in blue, red, green, orange, yellow or any desired combination of these colors and in some applications, may include a combination of emitting elements which produce white light. The EML 216 may also comprise a plurality of separate emissive sub-layers.

In addition to active electroluminescent materials that emit light, EML 216 can also include materials capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, triphenylamine, and triphenyldiamine.

Second Electrode 217:

In the bottom-emitting configuration, the second electrode 217 functions as the cathode (i.e. as the conductive layer which serves as an electron-injecting layer and which is comprised of a material with a low work function). While many materials, which can function as a cathode, are known to those of skill in the art, most preferably a composition that includes aluminum, indium, silver, gold, magnesium, calcium, lithium, lithium fluoride, cesium fluoride, sodium fluoride, and barium, or combinations thereof, or alloys thereof, is utilized. Aluminum, and combinations of calcium and aluminum, barium and aluminum, lithium fluoride and aluminum, lithium fluoride with calcium and aluminum, magnesium and silver or their alloys are especially preferred.

Preferably, the thickness of second electrode 423 is from about 10 nm to about 1000 nm, more preferably from about 50 nm to about 500 nm, and most preferably from about 100 nm to about 300 nm. While many methods are known to those of ordinary skill in the art by which the first electrode material may be deposited, vacuum deposition methods, such as thermal vacuum evaporation, sputtering or electron-beam deposition are preferred. Other layers (not shown) such as a barrier layer and getter layer may also be used to protect the electronic device. Such layers are well-known in the art and are not specifically discussed herein.

Multi-Element Light Extraction and Luminescence Conversion Layer (MLELC) 230

OLED device 205 as shown is a bottom-emitting OLED, and thus, the light emitted from the EML 217 passes through the substrate 208. In accordance with various embodiments of the invention, a multi-element light extraction and luminescence conversion (MLELC) layer 230 is disposed on the exposed external side of the substrate 208 (and thus, on the exterior of the OLED device 205) to modify and tune the light output from EL apparatus 200. In at least one embodiment of the invention, the MLCLE 230 is comprised of at least one light extraction element(s) 230A and at least one luminescence conversion element(s) 230B.

The luminescence conversion element(s) 230B will comprise of a fluorescent or phosphorescent material or any color changing material which can absorb light in one spectrum and emit light in another spectrum. The color-changing materials within the luminescence conversion element(s) 230B may be embedded in a transparent matrix. All of the luminescence conversion element(s) 230B can be of the same material or can be different material. For instance, some of the luminescence conversion element(s) 230B may be orange emitting while another portion is yellow emitting. Exemplary color-changing materials which could be used in forming the luminescence conversion element(s) 230B include, but are not limited to, scattering particles, organic and inorganic dyes, cerium doped garnets, nitride phosphors, ionic phosphors like $SrGa_2S_4:Eu^{2+}$ or $SrS:Eu^{2+}$, quantum dots, fluorescent dyes or conjugated polymers. The color-changing materials in each case can be dissolved or blended into transparent matrix materials such as silicone, epoxy, adhesives, polymethylmethacrylate, polycarbonate and so on. The shape/geometry of the luminescence conversion element(s) 230B can be flat or lens-like, or any desirable shape.

The light extraction element(s) 230A comprise materials that have a refractive index roughly equal to the transparent layer of the OLED or light source to which it is attached. In the embodiment shown in FIG. 1, light extraction element(s) 230A would have a refractive index that matches the refractive index of substrate 208 of OLED device 205. The light extraction element(s) 230A would also have a refractive index greater than or equal to the refractive index of the luminescence conversion elements 230B. In one embodiment of the invention, the light extraction element(s) 230A would have no color-changing materials, and in alternate embodiments, may include color-changing materials. The shape/geometry of the light extraction element(s) 230A is trapezoidal or emboss in nature. The angles of the geometry for light extraction element(s) 230A will be designed so as to enhance outcoupling of light. Preferably, both the light extraction element(s) and the luminescence conversion element(s) comprise of materials with a low absorption coefficient.

The ratio of the surface area (or width or other dimension) of the luminescence conversion element(s) 230A versus the light extraction element(s) 230B affects the total output spectrum of the EL apparatus. Due to the addition of this ratio, the use of a multi-element light extraction and luminescence conversion layer gives greater flexibility in designing the output spectra than when uniform conversions layers are used. The flexibility enables finding a better compromise between efficiency and color rendering.

The thickness of the MLELC layer 230 varies as among the light extraction element(s) 230A and the luminescence conversion elements 230B. It depends on the desired output spectrum of the device and the concentration of the CCM (color-changing material) in the luminescence conversion element(s) 230B. The concentration of the CCM may be limited by quenching and aggregation effects. Furthermore, scattering effects are dependent on the concentration of the CCM. In some embodiments, the MLELC layer 230 can be attached to the substrate 208 using an optically adhesive glue, which may additionally also be curable by ultraviolet radiation, or an index matching gel. In other embodiments, the MLELC layer 230 can be deposited or formed directly on substrate 208 by screen printing, inkjet printing or other selective deposition techniques or masking combined with non-selective deposition techniques. Further, the MLELC layer 230 can utilize a cross-linkable material which can then be chemically bonded to the substrate 208. More specifically, the light extraction element(s) 230A can be formed by molding an uncured layer(s), by a lithography process, or by other physical/chemical application or attachment. The luminescence conversion element(s) 230B can be fabricated by selective deposition techniques such as volume casting, inkjet printing, screen printing, shadow masking and so on.

Figure 2:
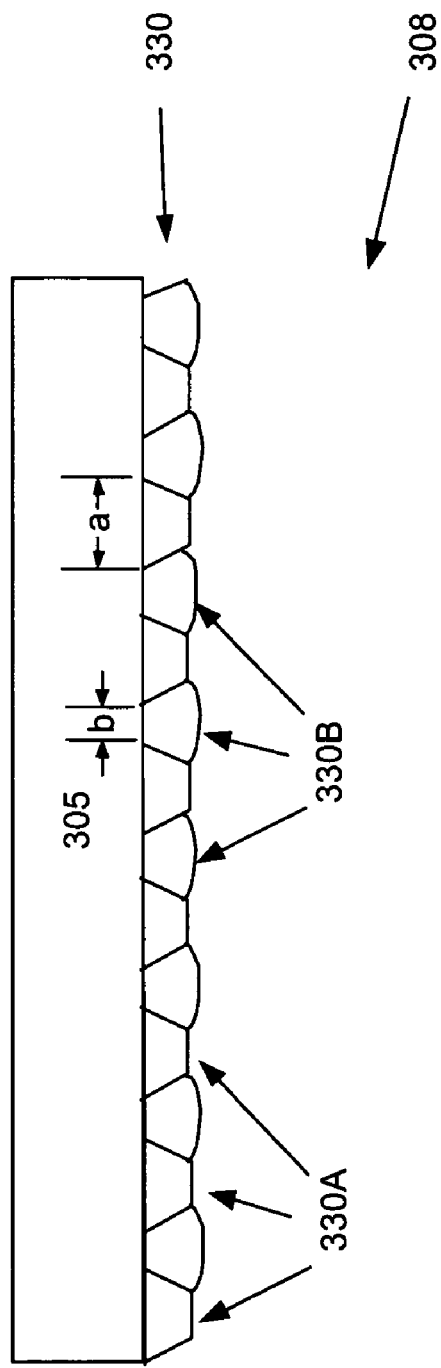
FIG. 2 shows a cross-sectional view of exemplary EL apparatus in accordance with at least one embodiment of the invention.

FIG. 2 shows a cross-sectional view of exemplary EL apparatus in accordance with at least one embodiment of the invention. EL apparatus 308 comprises a light source 305 and a multi-element light extraction and luminescence conversion (MLELC) layer 330 similar to MLELC layer 230 of FIG. 1. Layer 330 has at least one light extraction element(s) 330A and at least one luminescence conversion element(s) 330B. The width of the individual light extraction element(s) at the interface to the light source 305 is "a" while the width of the individual luminescence conversion element(s) at the interface to the light source 305 is "b". The ratio between "a" and "b" can be used to determine the output spectrum as described in equation 2 above (where "b" is 1-x and "a" is x). As shown, the physical thickness is uniform over the structured luminescence conversion layer 330, however, in other embodiments, the thickness may be varied from one luminescence conversion element to another or varied within even a given luminescence conversion element and may likewise vary as among the light extraction elements. The luminescence conversion element(s) 330B absorb a first spectrum of light emitted from light source 305 and emit a second spectrum of light. The light extraction element(s) 330A pass through the light emitted from light source 305 without spectral color shift (no specific or little intended color change) but with enhanced output. For instance, the light extraction element(s) 330A may comprise an optical adhesive or glass or similar light transmissive material. The shape, function and composition of the light extraction element(s) 330A and luminescence conversion elements 330B are similar to that described for light extraction element(s) 230A and luminescence conversion elements 230B of FIG. 1. The total light output and spectrum is a combination of the non-absorbed first spectrum of light, the emitted second spectrum of light and the effect of the light extraction due to the light extraction elements 330A.

Figure 3A:
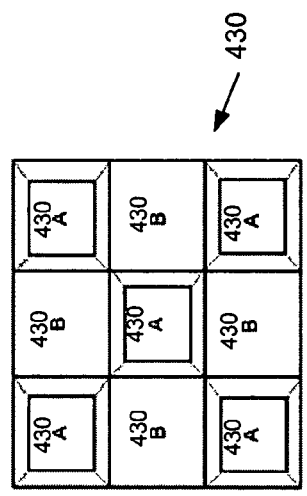
FIGS. 3A-3B illustrates exemplary patterns for multi-element light extraction and luminescence conversion layers from a top view.
Figure 3B:
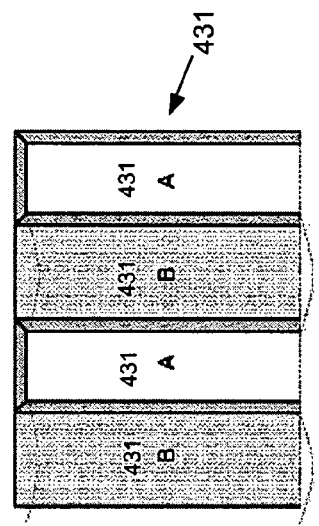

FIGS. 3A-3B illustrates exemplary patterns for multi-element light extraction and luminescence conversion layers from a top view. FIG. 3A shows a checkered pattern for a multi-element light extraction and luminescence conversion layer 430 where light extraction elements 430A and luminescence conversion elements 430B alternate in squares/rectangles across the top. FIG. 3B shows a striped pattern for the multi-element light extraction and luminescence conversion layer 431. The luminescence conversion elements 431A are shaded while the light extraction elements 431B are in an emboss shape or trapezoidal. This pattern would correspond, for instance, to the cross-sectional view of the multi-element light extraction and luminescence conversion layer 330 shown in FIG. 2. Other alternate patterns not shown include a mesh pattern where the light extraction elements and luminescence conversion elements are stripes which overlap one another. Yet other patterns not shown include a circular pattern for the color-changing regions. One example of this pattern would be cut conical shapes for light extraction elements surrounded by color changing materials which comprise the luminescence conversion element(s). The patterns shown in FIGS. 3A-3B are merely exemplary of the possible patterns for multi-element light extraction and luminescence conversion layers and are not intended to be limiting or exhaustive. Though shown in repeating patterns, the multi-element light extraction and luminescence conversion layer may also have random or non-repeating or partially repeating light extraction and luminescence conversion elements. Furthermore, as mentioned above the thicknesses of luminescence conversion elements or light extraction elements may not be uniform and as compared to one another may vary.

Top Emitting OLED Devices

In an alternative configuration to that shown in FIG. 1 and described above, the first electrode 211 functions as a cathode (the cathode is a conductive layer which serves as an electron-injecting layer and which comprises a material with a low work function). The cathode, rather than the anode, is deposited on the substrate 208 in the case of a top-emitting OLED. In this alternative configuration, the second electrode layer 217 functions as an anode (the anode is a conductive layer which serves as a hole-injecting layer and which comprises a material with work function greater than about 4.5 eV). The anode, rather than the cathode, is deposited on the semiconductor stack 214 in the case of a top-emitting OLED.

In embodiments where the OLED is "top-emitting" as discussed above, the anode may be made transparent or translucent to allow light to pass from the semiconductor stack 214 through the top of the device. In such cases, the multi-element light extraction and luminescence conversion layer would be attached, bonded or cured to the anode 217 (or to a glass or other material which encapsulates and protects the anode) rather than to the substrate 208 as with a bottom-emitting OLED shown in FIG. 1.

The OLED lighting sources and displays produced from a combination or arrays of EL devices described earlier can be used within applications such as information displays, general, industrial and area lighting, telephones, printers, computer displays, televisions, and illuminated signs.

As any person of ordinary skill in the art of light-emitting device fabrication will recognize from the description, figures, and examples that modifications and changes can be made to the embodiments of the invention without departing from the scope of the invention defined by the following claims.

What is claimed is:

1. An electroluminescent apparatus, comprising:
 a light source comprising a transparent layer capable of at least partially transmitting light out from said light source; and
 a multi-element light extraction and luminescence conversion layer disposed over said transparent layer and on the exterior of said light source, said multi-element light extraction and luminescence conversion layer comprising a plurality of light extraction elements and a plurality of luminescence conversion elements, wherein:
 said light extraction elements diffuse said light from said light sources,
 said luminescence conversion elements absorb a first spectrum of light from said light source and emit a second spectrum of light, the second spectrum of light being different from the first spectrum of light, and
 said light extraction elements and luminescence conversion elements are laterally adjacent to one another and directly adjacent to said transparent layer so that each of the light extraction elements and luminescence conversion elements contacts the transparent layer.

2. The apparatus of claim 1 wherein said light extraction elements have a refractive index matching the refractive index of the transparent layer.

3. The apparatus of claim 1 wherein said luminescence conversion elements comprise at least one color changing material.

4. The apparatus of claim 3 wherein said color changing material is a fluorescent or phosphorescent dye.

5. The apparatus of claim 1 wherein said light extraction elements have a refractive index greater than the refractive index of the luminescence conversion elements.

6. The apparatus of claim 3 wherein said color changing material is in a transparent matrix material.

7. The apparatus of claim 6 wherein said transparent matrix material is at least one of silicone, epoxy, polymethylmethacrylate or polycarbonate.

8. The apparatus of claim 1 wherein said multi-element layer is attached physically and/or chemically to said transparent layer.

9. The apparatus of claim 1 wherein said light extraction elements have a trapezoidal geometry.

10. The apparatus of claim 1 wherein said device is part of a light source application.

11. The apparatus of claim 1 wherein said light source is an OLED device.

12. The apparatus of claim 1 wherein said transparent layer is an electrode or an encapsulation layer and transmits light out of said apparatus.

13. The apparatus of claim 12 wherein said light extraction elements have a refractive index matching the refractive index of the transparent layer.

14. The apparatus of claim 12 wherein said luminescence conversion elements comprises at least one color changing material.

15. The apparatus of claim 14 wherein said color changing material is a fluorescent or phosphorescent dye.

16. The apparatus of claim 14 wherein said color changing material is in a transparent matrix material.

17. The apparatus of claim 16 wherein said transparent matrix material is at least one of silicone, epoxy, polymethylmethacrylate or polycarbonate.

18. The apparatus of claim 12 wherein said light extraction elements have a refractive index greater than the refractive index of the luminescence conversion elements.

19. The apparatus of claim 12 wherein said multi-element layer is attached physically and/or chemically to said transparent layer.

20. The apparatus of claim 12 wherein said light extraction elements have a trapezoidal geometry.

21. The apparatus of claim 12 wherein said device is part of a light source application.

22. The apparatus of claim 12 wherein said light source is an OLED device.

23. The apparatus of claim 12 wherein said light extraction elements comprise a non-absorbing, light transmissive material.

24. The apparatus of claim 12 wherein said luminescence conversion elements comprise at least one of an organic fluorescent dye, perylene, coumarin, fluorescent conjugated polymer, organic phosphorescent dye, conjugated phosphorescent polymer, inorganic color changing material, cerium doped garnet, nitride phosphor, ionic phosphor, or quantum dot.

25. The apparatus of claim 12 wherein said luminescence conversion elements have a lens-like or flat geometry.

26. The apparatus of claim 12 wherein said luminescence conversion elements and said light extraction elements comprise materials with a low absorption coefficient.

27. The apparatus of claim 12 wherein said plurality of light extraction elements and plurality of luminescence conversion elements are arranged in an alternating pattern.

28. The apparatus of claim 12 wherein said plurality of light extraction elements and a plurality of luminescence conversion elements are arranged in a striped pattern.

29. The apparatus of claim 12 wherein said plurality of light extraction elements and a plurality of luminescence conversion elements are arranged in a mesh pattern.

30. The apparatus of claim 12 wherein said plurality of light extraction elements and plurality of luminescence conversion elements are arranged such that said plurality of luminescence conversion elements are conically sectioned.

31. The apparatus of claim 1 wherein said transparent layer is a substrate.

32. The apparatus of claim 1 wherein said light extraction elements comprise a non-absorbing, light transmissive material.

33. The apparatus of claim 1 wherein said luminescence conversion elements comprise at least one of an organic fluorescent dye, perylene, coumarin, fluorescent conjugated polymer, organic phosphorescent dye, conjugated phosphorescent polymer, inorganic color changing material, cerium doped garnet, nitride phosphor, ionic phosphor, or quantum dot.

34. The apparatus of claim 1 wherein said luminescence conversion elements have a lens-like or flat geometry.

35. The apparatus of claim 1 wherein said luminescence conversion elements and said light extraction elements comprise a material with a low absorption coefficient.

36. The apparatus of claim 1 wherein said plurality of light extraction elements and plurality of luminescence conversion elements are arranged in an alternating pattern.

37. The apparatus of claim 1 wherein said plurality of light extraction elements and plurality of luminescence conversion elements are arranged in a striped pattern.

38. The apparatus of claim 1 wherein said plurality of light extraction elements and a plurality of luminescence conversion elements are arranged in a mesh pattern.

39. The apparatus of claim 1 wherein said plurality of light extraction elements and a plurality of luminescence conversion elements are arranged such that said plurality of luminescence conversion elements are conically-sectioned.

* * * * *

UNITED STATES PATENT AND TRADEMARK OFFICE
CERTIFICATE OF CORRECTION

PATENT NO. : 7,321,193 B2
APPLICATION NO. : 11/345795
DATED : January 22, 2008
INVENTOR(S) : Homer Antoniadis It is certified that error appears in the above-identified patent and that said Letters Patent is hereby corrected as shown below:

Column 9, Line 39 at Claim 1; replace:
 "light sources;" with
 -- light source; --

Column 10, Line 54 at Claim 28; replace:
 "light extraction elements and a plurality of luminescence;" with
 -- light extraction elements and plurality of luminescence; --

Column 10, Line 57 at Claim 29; replace:
 "light extraction elements and a plurality of luminescence;" with
 -- light extraction elements and plurality of luminescence; --

Column 12, Line 5 at Claim 38; replace:
 "light extraction elements and a plurality of luminescence;" with
 -- light extraction elements and plurality of luminescence; --

Column 12, Line 8 at Claim 39; replace:
 "light extraction elements and a plurality of luminescence;" with
 -- light extraction elements and plurality of luminescence; --

Signed and Sealed this

Thirteenth Day of May, 2008

JON W. DUDAS
*Director of the United States Patent and Trademark Office*